United States Patent
Ong et al.

(10) Patent No.: US 9,373,405 B2
(45) Date of Patent: Jun. 21, 2016

(54) AUTO RESUME OF IRREGULAR ERASE STOPPAGE OF A MEMORY SECTOR

(71) Applicant: Spansion LLC, Sunnyvale, CA (US)

(72) Inventors: Wei-Kent Ong, Penang (MY); Mee-Choo Ong, Penang (MY)

(73) Assignee: CYPRESS SEMICONDUCTORS CORPORATION, San Jose, CA (US)

( * ) Notice: Subject to any disclaimer, the term of this patent is extended or adjusted under 35 U.S.C. 154(b) by 141 days.

(21) Appl. No.: 14/092,554

(22) Filed: Nov. 27, 2013

(65) Prior Publication Data
US 2015/0149696 A1     May 28, 2015

(51) Int. Cl.
*G06F 12/02* (2006.01)
*G11C 16/16* (2006.01)
*G11C 5/14* (2006.01)
*G11C 16/30* (2006.01)

(52) U.S. Cl.
CPC .............. *G11C 16/16* (2013.01); *G11C 5/148* (2013.01); *G11C 16/30* (2013.01)

(58) Field of Classification Search
None
See application file for complete search history.

(56) References Cited

U.S. PATENT DOCUMENTS

| | | | | |
|---|---|---|---|---|
| 2010/0122016 A1* | 5/2010 | Marotta | ................. | G11C 16/16 711/103 |
| 2011/0113187 A1* | 5/2011 | Kashiwagi | .......... | G06F 12/0246 711/103 |
| 2011/0208898 A1* | 8/2011 | Shin | .................... | G06F 12/0246 711/103 |
| 2012/0254515 A1* | 10/2012 | Melik-Martirosian | | G11C 16/14 711/103 |
| 2014/0047167 A1* | 2/2014 | Kwak | ................. | G06F 12/0246 711/103 |
| 2015/0177993 A1* | 6/2015 | Ide | ........................ | G06F 3/0611 711/103 |

* cited by examiner

*Primary Examiner* — Gary Portka

(57) ABSTRACT

Disclosed herein are system, method and/or computer program product embodiments for automatically resuming an irregular erasure stoppage in a sector of a memory system. An embodiment includes storing information related to any completed sub-stage of a multi stage erasure process and the corresponding memory sector address in a dedicated memory. After an irregular erasure stoppage occurs, an embodiment reads the information from the dedicated memory and resumes the erasure process of the memory sector from the last sub-stage completed.

20 Claims, 9 Drawing Sheets

AUTO RESUME OF IRREGULAR ERASE STOPPAGE OF A MEMORY SECTOR

BACKGROUND

It is important to ensure trustworthiness of data stored in non-volatile memory device, such as a flash memory. File system software is used to control various sub-stages of program and erase processes, for example, to accomplish data integrity. And all sub-stages are monitored to verify successfully complete without interruption. But interruptions can occur during any sub-stage due to power noise, power lockout, power loss, hardware reset, operation hang-ups, or the like. Such an interruption is referred to as irregular stoppage.

If an irregular stoppage occurs during a sector erase process, for example, the flash memory can be trapped in any one of the sub-stages. The indeterminate state can cause severe issues, such as read/verify errors, and the like. It also can cause unreliable detection of blank sectors because the sector may appear blank even though further erasure is required for reliable data storage.

One approach to address these issues includes performing a memory file system consistency check of all storage sectors during system power up for interrupted sector erase detection. In this approach, the system will restart a sector erase upon detection of a problem. In another approach sector erase status is evaluated during each system software sector erase process before execute blank check. If an indeterminate state is detected, the system is required to restart sector erase. Such solutions consume many clock cycles.

SUMMARY

Disclosed herein are method, system, and computer program product embodiments, and/or combinations and subcombinations thereof, for resuming an irregular stoppage in a memory sector of a memory device.

An embodiment includes a method for resuming an irregular erasure stoppage of a memory sector erasure process for a memory device. The memory device includes multiple sectors, and the memory sector erasure process includes multiple sub-stages. The method for resuming an irregular erasure stoppage includes storing information indicating a last sub-stage of the memory sector erasure process that completed before the irregular erasure stoppage occurred. And if the last sub-stage of the erasure process is not a final sub-stage of the erasure process for the memory sector, the method resumes the erasure process of that memory sector.

In an embodiment, the address of the memory sector being erased when the irregular stoppage occurred will be stored. The address of the memory sector and information indicating the last sub-stage of the memory sector erasure process to complete are stored in a dedicated memory location.

In an embodiment, the stored memory sector address is associated with the information indicating the last sub-stage of the memory sector erasure process that completed before the irregular erasure stoppage. In an embodiment, the association includes storing the address and the sub-stage erasure information together.

In an embodiment, the erasure process resumes after occurrence of an event. In an embodiment, the event is the beginning of a Power on Reset (POR) cycle.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate the present invention and, together with the description, further serve to explain the principles of the invention and to enable a person skilled in the relevant art(s) to make and use the invention. Embodiments of the invention are described, by way of example only, with reference to the accompanying drawings, in which.

In the drawings, like reference numbers generally indicate identical or similar elements. Additionally, generally, the leftmost digit(s) of a reference number identifies the drawing in which the reference number first appears.

DETAILED DESCRIPTION

Memory System

Figure 1:
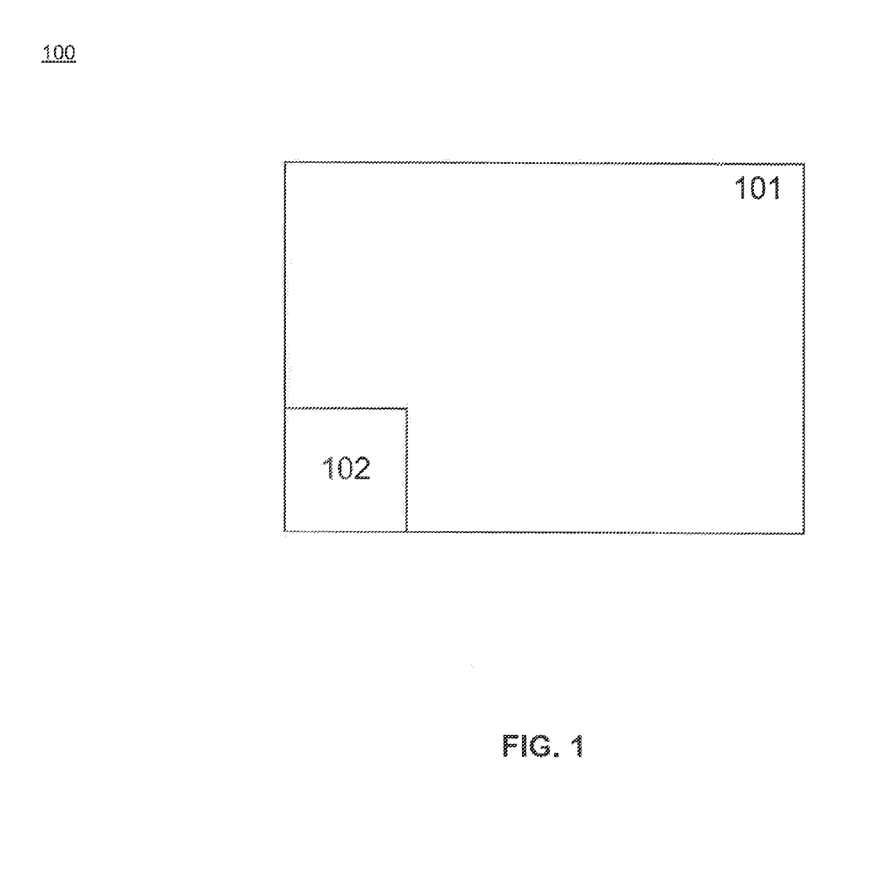
FIG. 1 is a block diagram of a memory device and a dedicated memory location, according to an example embodiment.

FIG. 1 illustrates a memory system 100 having a portion 101 that includes one or more memory sectors, according to an embodiment. As such, the portion 101 further includes a dedicated portion 102. In an embodiment, the dedicated portion 102 is used for storing information related to the erasure process of the memory sectors of portion 101 of the memory system 100.

Figure 2:
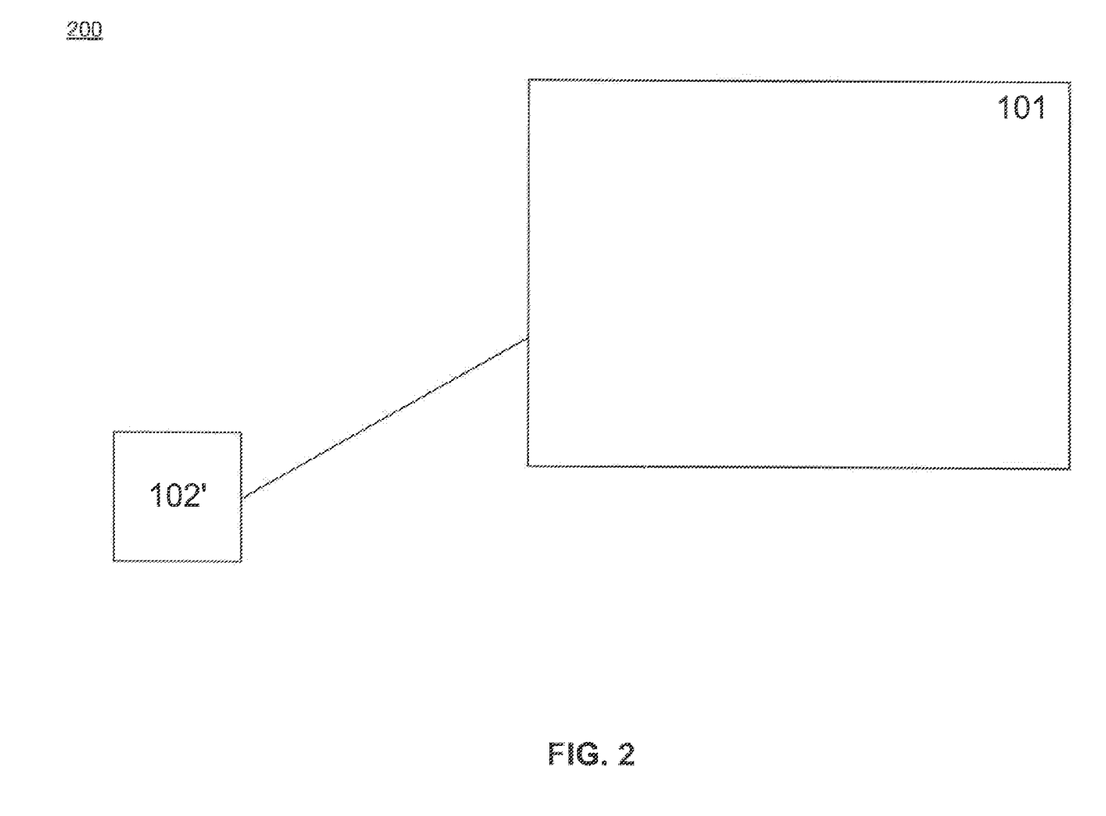
FIG. 2 is a block diagram of a memory device and a dedicated memory location, according to an example embodiment.

FIG. 2 illustrates a memory system 200 that comprises a portion 101 that includes one or more memory sectors, according to an embodiment. As such, in an embodiment, the memory system 200 also comprises a dedicated memory 102' that is distinct from portion 101. The dedicated portion 102' is used for storing information related to the erasure process of the memory sectors of portion 101 of the memory system 200.

In an embodiment, the dedicated memory section (102 in FIG. 1 or 102' in FIG. 2) is used to track the progress of a memory sector erase process. The dedicated memory stores the sector address of the sector being erased along with the information showing the status of the erasure process. For redundancy, the information can be used on more than one dedicated memory.

In an embodiment the dedicated memory is a sector of the memory system.

Memory Sector Erasure Process

Figure 3:
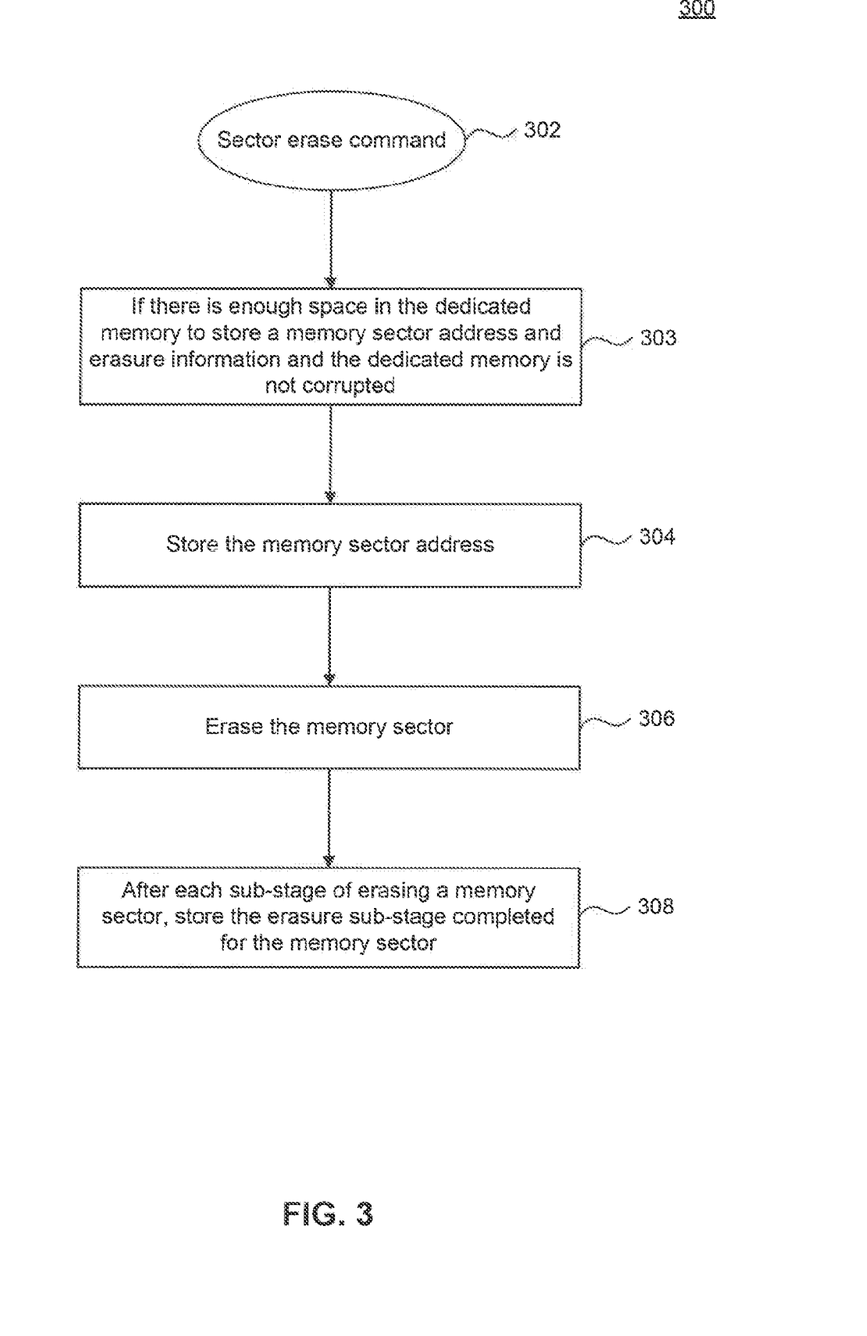
FIG. 3 is a flowchart illustrating a method for storing the erasure information.

FIG. 3 is a flowchart illustrating a method for erasing a memory sector and storing the erasure information. After receiving a sector erase command at step 302, the method 300 checks, at step 303, to verify whether there is enough space in the dedicated memory to store a memory sector address and erasure information. At this step, method 300 also checks to ensure that the dedicated memory is not corrupted, for example due to a previous irregular stoppage in the dedicated memory.

If there is enough space in the dedicated memory and it is not corrupted, the method 300 proceeds, at step 304, to store the address of the memory sector address that corresponds to the sector erase command. In an embodiment, the method 300 stores the memory sector address in a dedicated memory such as 102 or 102'.

Method 300 begins erasing the memory sector at step 306. Erasing a memory sector includes multiple sub-stages. After each sub-stage of erasing the memory sector, the method 300, at step 308, stores the information indicating the completed sub-stage of the erasure process. In an embodiment, the information indicating the sub-stage is also stored in a dedicated memory such as 102 or 102'.

Storing Erasure Information in the Dedicated Memory

Figure 4:
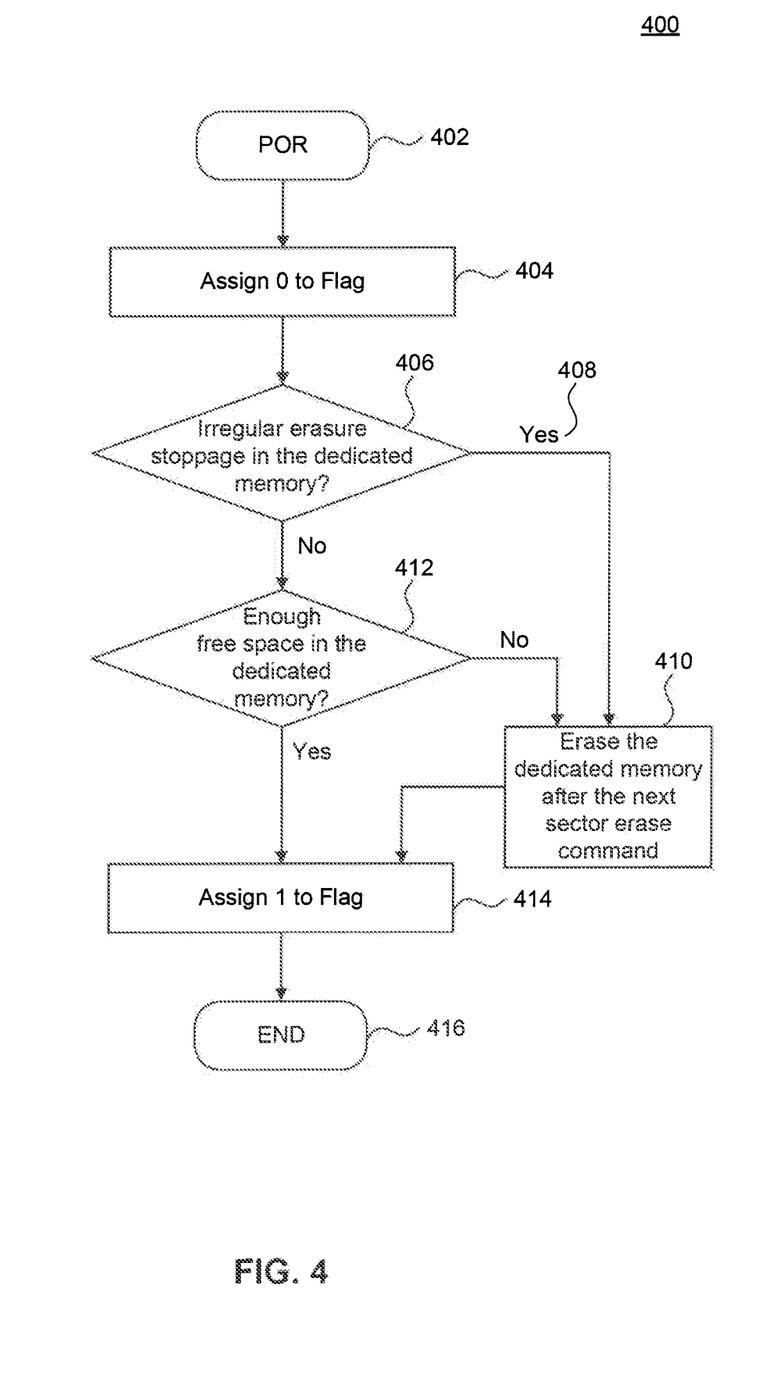
FIG. 4 is a flowchart illustrating a method for checking the dedicated memory status.

FIG. 4 is a flowchart illustrating a method for checking the dedicated memory status. The dedicated memory status may indicate that there is not enough space to store any more memory sector address and the related erasure process information. The dedicated memory status may also indicate that there has been an irregular stoppage when erasing the dedicated memory itself. If any of these conditions are true, the dedicated memory will be erased after the next sector erase command. Erasing of the dedicated memory can be accomplished using techniques well known to persons having ordinary skill in the relevant art.

FIG. 4 illustrates a flowchart for verifying the status of the dedicated memory according to an embodiment. After the beginning of Power on Reset (POR) cycle at step 402, the method 400 assigns zero to a Flag in step 404. In an embodiment, the Flag is an indicator of the status of the dedicated memory, and will be used to decide whether it is necessary to erase the dedicated memory after the next sector erase command. POR techniques are well known to persons having ordinary skill in the relevant art.

At step 406, method 400 verifies whether there has been an irregular erasure stoppage in the dedicated memory. In an embodiment, method 400 detects whether there has been an irregular erase stoppage in the dedicated memory based on the information stored in a predetermined location in the dedicated memory. In an embodiment, the predetermine location is the last plurality of bytes in the dedicated memory. In such embodiment, a predetermined data pattern in the last plurality of bytes of the dedicated memory will indicate that there has not been an irregular stoppage in the dedicated memory and that corresponding data is trustworthy. By reading the predetermined portion, method 400 detects whether there has been irregular stoppage in the dedicated memory or not.

If there has been an irregular erasure stoppage in the dedicated memory, method 400 erases the dedicated memory after the next erase command at step 410. After erasing the dedicated memory, method 400 assigns "1" to a Flag at step 412 and the process ends at step 414.

If method 400 determines at step 406 that there has not been an irregular erasure stoppage in the dedicated memory, a verification is performed at step 412. This verification determines whether there is enough free space in the dedicated memory for storing a memory sector address and the corresponding erasure sub-stage information to the memory sector. If there is enough space in the dedicated memory, method 400 assigns "1" to the Flag at step 414 and the process ends at step 416.

In an embodiment, if at step 412, method 400 finds that there is not enough space in the dedicated memory to store a memory sector address and the associated erasure process sub-stage information, method 400 erases the dedicated memory after the next sector erase command. After erasing the dedicated memory, method 400 assigns "1" to the Flag and the process ends at step 416.

In an embodiment, the Flag is stored outside the dedicated memory and the processes for reading and writing to the dedicated memory have access to the value of the Flag.

Figure 5:
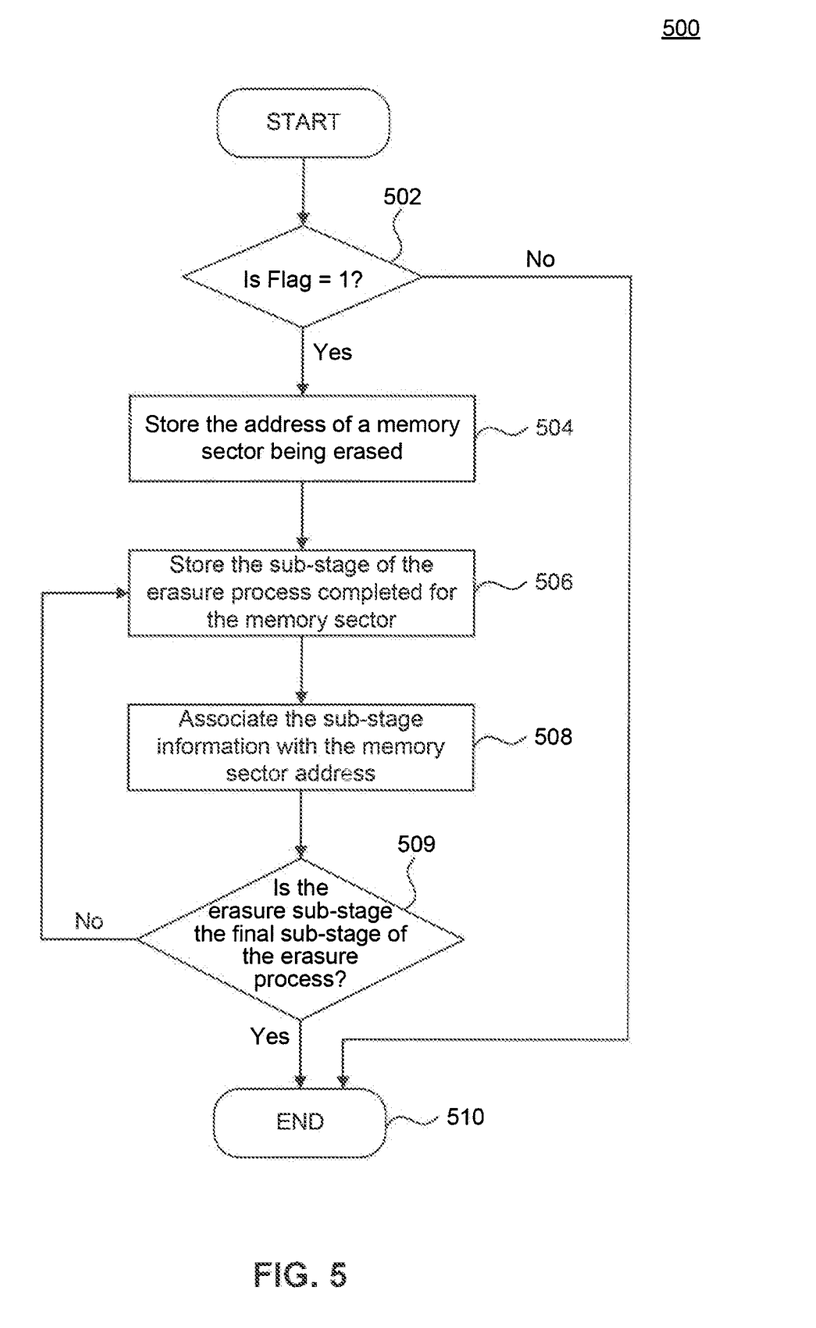
FIG. 5 is a flowchart illustrating a method for storing the memory sector address and the erasure information in the dedicated memory.

FIG. 5 is a flowchart illustrating a method 500 for storing the memory sector address and the erasure information in the dedicated memory. Method 500 checks the Flag at step 502. In an embodiment, if the Flag is equal to zero, it indicates that either the dedicated memory is corrupted, for example due to an irregular stoppage in erasing the dedicated memory, or it indicates that there is not enough space for storing a memory sector address and the reassure information. If the Flag is equal to zero, the method 500 stops at step 510. If there has been an irregular erasure stoppage in the dedicated memory or if there is not enough space in the dedicated memory, method 400 will erase the dedicated memory.

If Flag is equal to one, method 500 continues to store information in the dedicated memory. Method 500, at step 504, stores in the dedicated memory the address of the memory sector being erased.

At step 506, after method 500 completes a sub-stage of the memory sector erasure process, method 500 stores in the dedicated memory the information indicating the sub-stage of the erasure process completed for the memory sector.

At step 508, method 500 associates the sub-stage information of the erasure process with the memory sector address stored at step 504. In an embodiment, the method 500 associates the address with the erasure information by combining the two in multiple consecutive bytes. In an embodiment, the process allocates predetermined portions of the consecutive bytes for storing address and other predetermined portions for the erasure substage information.

In an embodiment, at step 506, method 500 only updates the information indicating the sub-stage of the erasure process completed, to reflect the most recent sub-stage of the erasure process of the memory sector in the dedicated memory. In such embodiment, the method of associating the erasure sub-stage with the memory address remains the same. For example, if the association method is to combine the memory sector address and the erasure sub-stage information in multiple consecutive bytes, in this embodiment at step 506, method 500 will only update the sections or sub-sections storing the erasure sub-stage information.

At step 509, method 500 verifies whether the current erasure sub-stage is the final sub-stage of the erasure process. If the current sub-stage is not the final, method 500 repeats steps 506 and 508 for the next completed sub-stage.

If the current sub-stage is the final sub-stage, the method 500 ends at step 510.

Option for Disabling Storing and Reading the Information Regarding Erasure Process In an embodiment, no information regarding the erasure process of a memory sector and the address of the memory sector will be stored or read from the dedicated memory. In such embodiment, method 300, after receiving the sector erase command at step 302, will merely proceed to erase the memory sector without storing the memory sector address at step 304 and the erasure sub-stage information at step 308.

Reading the Erasure Information from the Dedicated Memory

Figure 6:
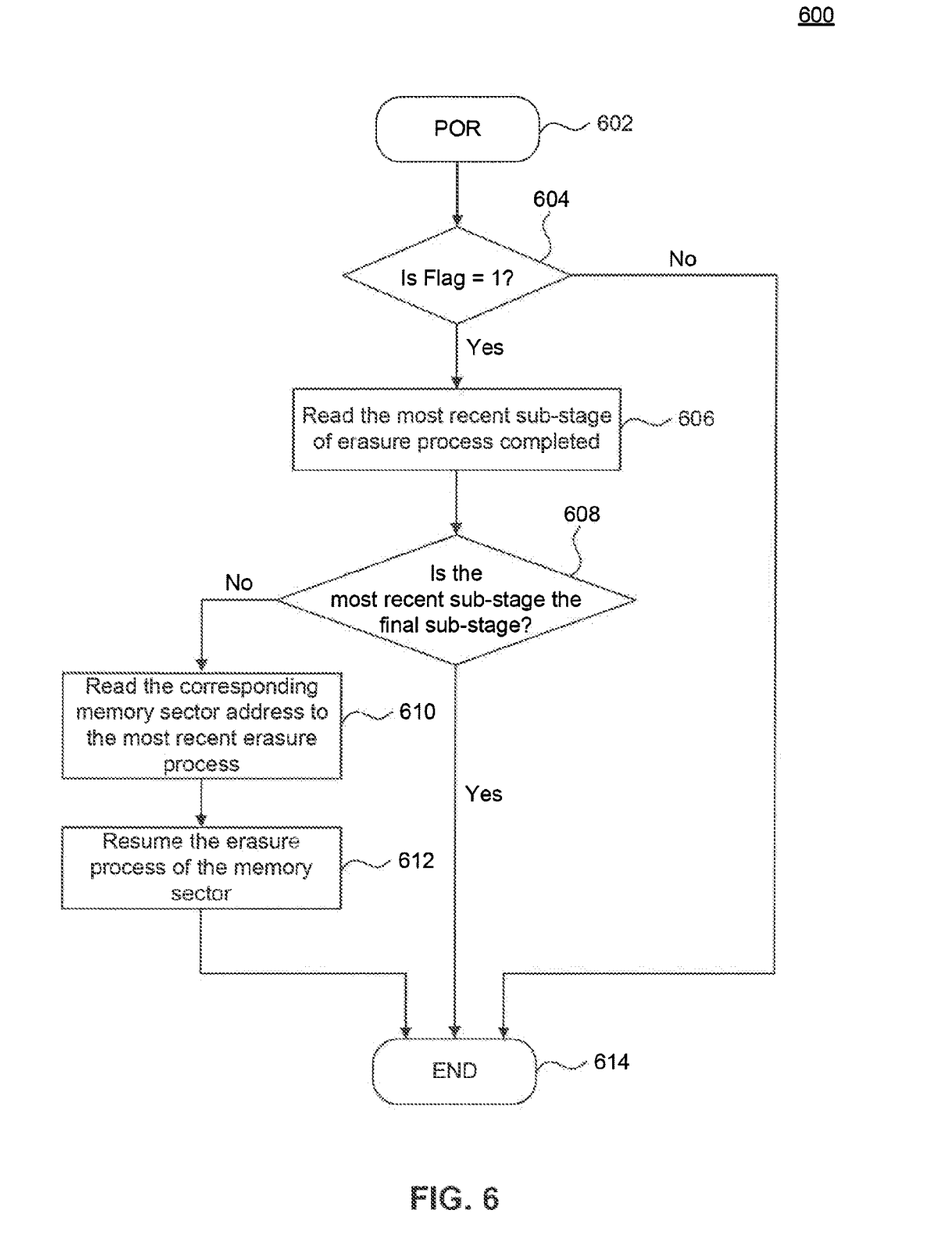
FIG. 6 is a flowchart illustrating a method for reading the erasure information from the dedicated memory.

FIG. 6 is a flowchart illustrating a method 600 for reading the erasure information from the dedicated memory. After the beginning of the POR cycle, method 600 checks to see if the Flag is equal to 1. The process ends in step 614 if the Flag is equal to zero.

If the Flag is equal to 1, the method 600 reads the last sub-stage of the erasure process of a memory sector that was completed before the beginning of POR. In an embodiment, the last sub-stage of the erasure process and the corresponding memory sector address represents the most recent information stored in the dedicated memory before the beginning of POR.

Method 600 checks at step 608 whether the most recent sub-stage information stored in the memory is a final sub-stage of a given erasure process. If the most recent sub-stage information, for that memory sector, stored in the dedicated memory is a final sub-stage, it indicates that the erasure process was completed successfully. In other words, there has been no irregular stoppage in erasing that memory sector. In this case, method 600 ends at step 614.

After an irregular stoppage of the erasure process of any memory sector, there will be a POR. Therefore if the most recent sub-stage information stored in the dedicated memory is different from a final sub-stage of a given erasure process, there has been an irregular stoppage during the erasure process. In this case, method 600 reads the corresponding memory sector address to the most recent sub-stage information if the most recent erasure process.

At step 612, method 600 resumes the erasure process of the memory sector from the last sub-stage stored in the dedicated memory. Method 600 ends at step 614.

Data Structure Stored in the Dedicated Memory

In what follows, a "section" or a "subsection" refers to one or more number of bits. A "bit pattern" of a section or a sub-section refers to a specific set of values of bits in the section or sub-section.

Figure 7:
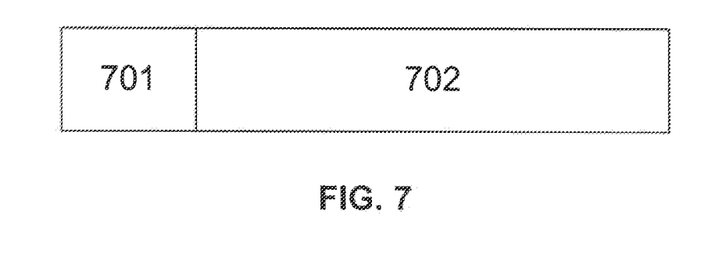
FIG. 7 is a block diagram slowing an example embodiment of data structure stored in the dedicated memory.

FIG. 7 is a block diagram showing an example embodiment of data structure stored in the dedicated memory. In an embodiment, section 701 contains the information indicating a completed sub-stage of an erasure process of a memory sector. Section 702 contains the information indicating the address of the memory sector for which the erasure sub-stage information is stored in section 701. In an embodiment the erasure information in section 701 and the address information in section 702 are concatenated to form a series of one or more number of bytes.

In an embodiment, a predetermined set of bits are assigned to sections 701 and 702. In such embodiment, specific bit patterns in section 701 correspond to specific sub-stages of the erasure process with a one to one correspondence. For example, a specific bit pattern in section 701 indicates that the final substage of an erasure process is completed for the memory sector with the address indicated in section 702.

Figure 8:
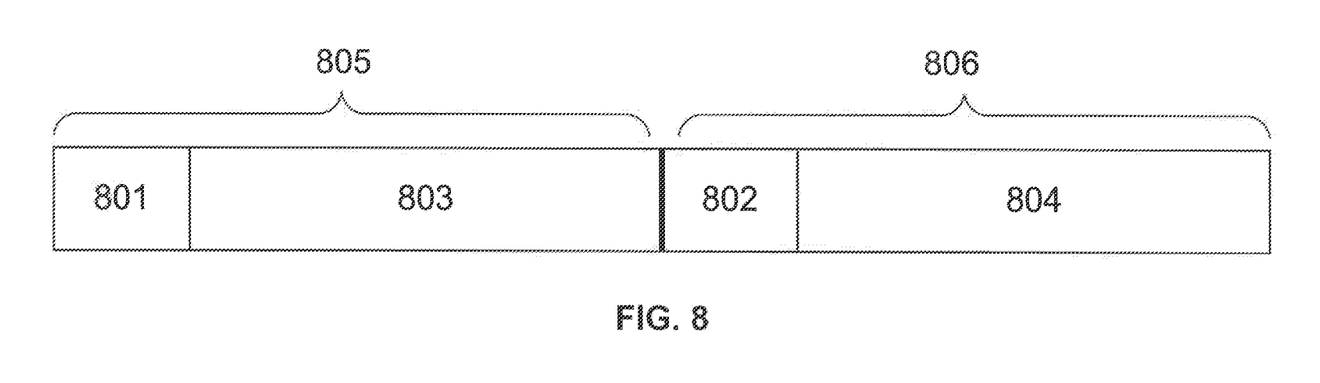
FIG. 8 is a block diagram showing an example embodiment of data structure stored in the dedicated memory.

FIG. 8 is a block diagram showing another embodiment of data structure stored in the dedicated memory. In such embodiment, two concatenated sections 805 and 806 jointly store the information indicating a sub-stage of erasure process completed on a memory sector (stored in sub-sections 801 and 803) and the corresponding address of the memory sector (stored in sub-sections 803 and 804).

In an embodiment, a predetermined set of bits in sections 805 and 806 are assigned to sub-sections 801 and 802. In such embodiment, specific bit patterns in sub-section 801 and 802 together, correspond to specific substages of the erasure process with a one to one correspondence. In such embodiment, the process for reading the dedicated memory determines whether the sub-stage is a final sub-stage by comparing the bit pattern in sub-sections 801 and 802 with the bit pattern of a final sub-stage.

Memory sector address is stored in sub-section 803 of section 805 and sub-section 804 of section 806. In other words, sub-sections 803 and 804 together show the memory sector address for which the information of the completed erasure sub-stage is shown in sub-sections 801 and 802 together. In such embodiment, sections 805 and 806 are stored next to each other in the dedicated memory.

In an embodiment, sections 805 and 806 are each one byte. Other configurations are contemplated within the scope of the present invention.

In an embodiment, the number of bits allocated to storing the erasure sub-stage information (in sub-sections 801 and 802) and the corresponding memory sector address tin sub-sections 803 and 804) are predetermined. In such embodiment, a process that reads the dedicated memory, checks these predetermined locations to find information related to an erasure process sub-stage.

Detecting the Most Recent Erasure Information in the Dedicated Memory

Figure 9:
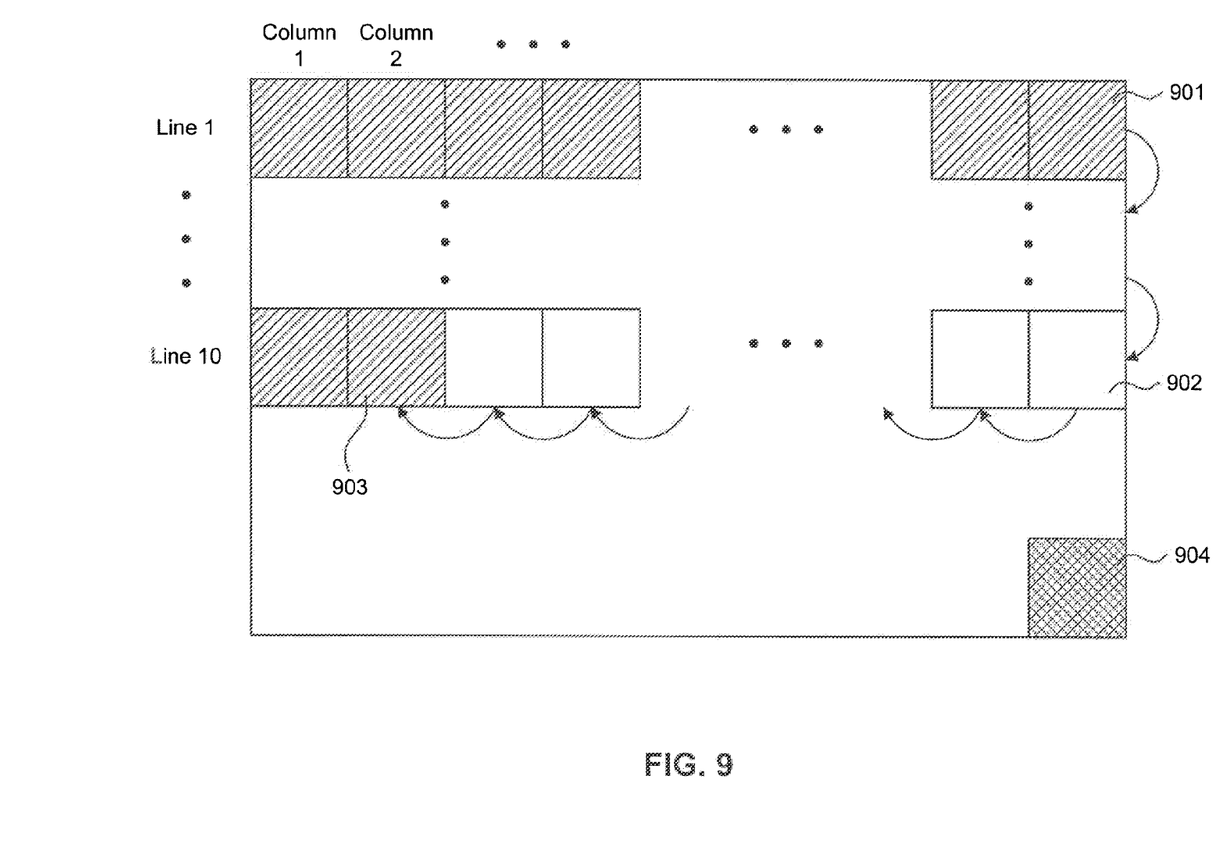
FIG. 9 is a block diagram showing the dedicated memo according to an example embodiment.

FIG. 9 is a block diagram showing the dedicated memory according to an embodiment.

In the embodiment shown in FIG. 9, each line and column number indicate a location in the dedicated memory. For example the dedicated memory shown in FIG. 9 includes locations 901, 902, 903, etc.

In an embodiment, the locations of the dedicated memory contain three categories of data. A dedicated memory location may carry a category of data showing a sub-stage of the erasure process of a memory sector and the address of the memory sector. A dedicated memory location may carry a category of data that indicates the state of information in the dedicated memory. A dedicated memory location may otherwise be blank (carrying no relevant data to the operation or state of the memory system).

The state of the dedicated memory indicates whether all the information in the dedicated memory is trustworthy or not. In an embodiment, the dedicated memory state indicates whether there has been an irregular erasure stoppage in the dedicated memory.

In an embodiment, each memory location (e.g. 901, 902, etc.) contains a data structure similar to the data structure illustrated in FIG. 8. In such embodiment, each memory location contains two bytes. Further, a predetermined set of bits within each byte is assigned to sub-sections 801 and 802.

In an embodiment, a unique bit pattern within sub-sections 801 and 802 can indicate that the memory location contain data relevant to the status of the dedicated memory. A different bit pattern within sub-sections 801 and 802 can indicate a blank memory location. A set of bit patters unique to the erasure process can indicate a memory location containing address and a completed sub-stage of erasure process of a memory sector.

In an embodiment, location 904 in the dedicated memory (the last column and line) contains information indicating the state of the dedicated memory. In an embodiment, the information in location 904 indicates whether there has been an irregular stoppage in erasing the dedicated memory during a previous erase process. In such embodiment, method 400 at step 406 reads this location of the dedicated memory, in order to find out whether or not there has been an irregular stoppage in erasing the dedicated memory.

In an embodiment, in order to find the last sub-stage of erasure process completed, the method reads the dedicated memory location on the first line, last column. If the data in that location does not indicate a blank location, the process moves to the next line, and reads the dedicated memory location on the last column.

For the first line that the location data on the last column indicate a blank location, (location 902 in the example embodiment shown in FIG. 9), the process reads the previous location on the same line, until it finds the first location that does not contain the data indicating a bank location.

Such location contains the information of the last sub-stage of the last memory sector erased prior to the current POR cycle. In the example embodiment shown in FIG. 9, location 903 contains the information indicating the most recent sub-stage of the erasure process completed before the current POR.

For example, assuming the structure of FIG. 8 is used in any of the locations of the dedicated memory, the process reads the predetermined set of bits corresponding to sub-sections 801 and 802 from the location on the first line, last column of the dedicated memory.

If the bit pattern does not indicate a blank memory, the process moves to the next line, and reads the bit patterns of the same portions of the last column location. For the first line that the information indicate a blank location on the last column, (location 902 in the example embodiment shown in FIG. 9), the process reads the previous location on the same line, until it finds the first location that does not contain the bit pattern unique to a bank location in the set of bits corresponding to sub-sections 801 and 802. Such location contains the information of the most recent sub-stage of the last memory sector erased prior to the current POR cycle.

In the example embodiment shown in FIG. 9, location 903 contains the information indicating the most recent sub-stage of the erasure process completed before the current POR. The bit patterns corresponding to sub-sections 801 and 802 within location 903, indicate the sub-stage of the erasure process.

Example Computer System

Figure 10:
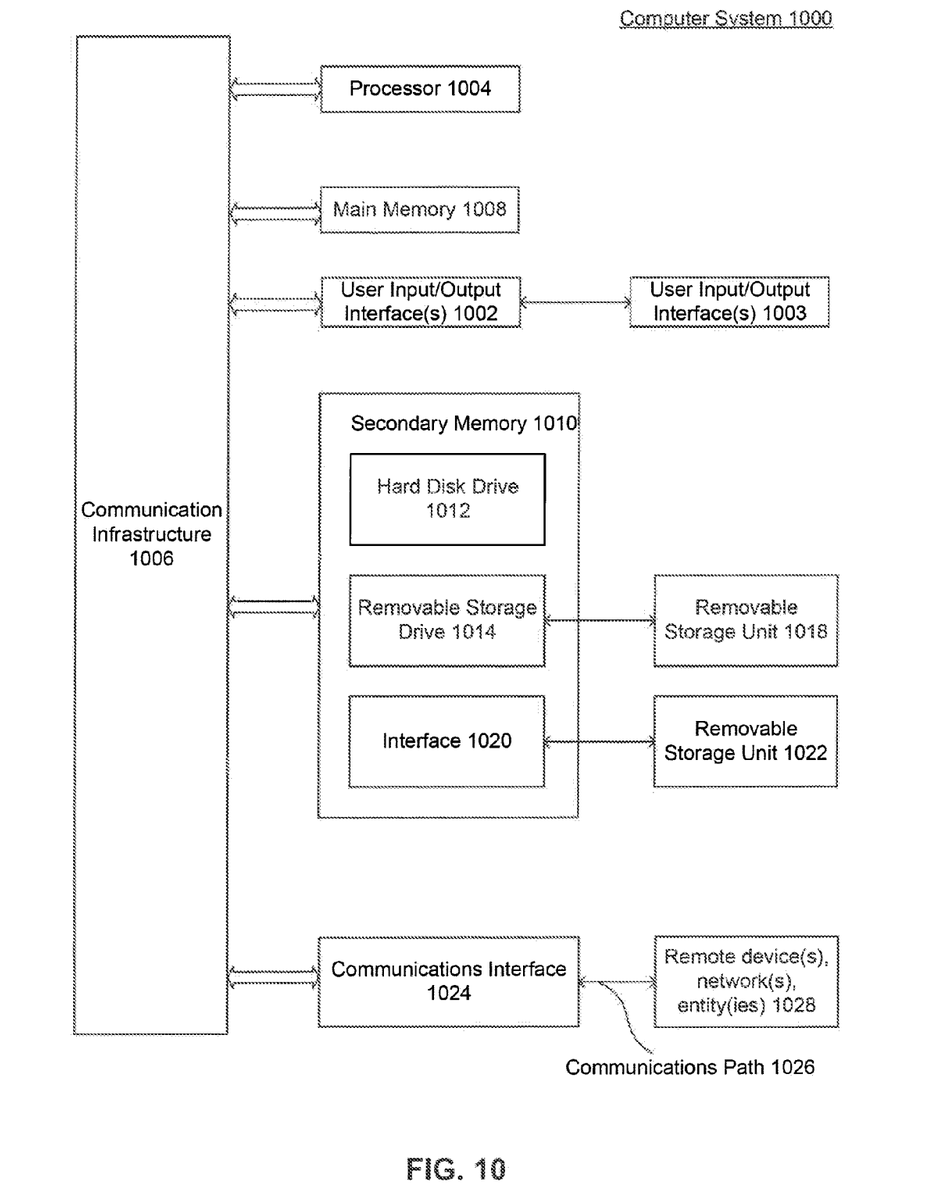
FIG. 10 is an example computer system for implementing various embodiments.

Various embodiments can be implemented, for example, using one or more well-known computer systems, such as computer system 1000 shown in FIG. 10. Computer system 1000 can be any well-known computer capable of performing the functions described herein, such as computers available from international Business Machines, Apple, Sun, HP, Dell, Sony, Toshiba, etc.

Computer system. 1000 includes one or more processors (also called central processing units, or CPUs), such as a processor 1004. Processor 1004 is connected to a communication infrastructure or bus 1006.

One or more processors 1004 may each be a graphics processing unit (GPU). In an embodiment, a GPU is a processor that is a specialized electronic circuit designed to rapidly process mathematically intensive applications on electronic devices. The GPU may have a highly parallel structure that is efficient for parallel processing of large blocks of data, such as mathematically intensive data common to computer graphics applications, images and videos.

Computer system 1000 also includes user input/output device(s) 1003, such as monitors, keyboards, pointing devices, etc., which communicate with communication infrastructure 1006 through user input/output interface(s) 1002.

Computer system 1000 also includes a main or primary memory 1008, such as random access memory (RAM). Main memory 1008 may include one or more levels of cache. Main memory 1008 has stored therein control logic (i.e., computer software) and/or data. In an embodiment, at least main memory 1008 may be implemented and/or function as described herein.

Computer system 1000 may also include one or more secondary storage devices or memory 1010. Secondary memory 1010 may include, for example, a hard disk drive 1012 and/or a removable storage device or drive 1014. Removable storage drive 1014 may be a floppy disk drive, a magnetic tape drive, a compact disk drive, an optical storage device, tape backup device, and/or any other storage device/drive.

Removable storage drive 1014 may interact with a removable storage unit 1018. Removable storage unit 1018 includes a computer usable or readable storage device having stored thereon computer software (control logic) and/or data. Removable storage unit 1018 may be a floppy disk, magnetic tape, compact disk, DVD, optical storage disk, and/any other computer data storage device. Removable storage drive 1014 reads from and/or writes to removable storage unit 1018 in a well-known manner.

According to an exemplary embodiment, secondary memory 1010 may include other means, instrumentalities or other approaches for allowing computer programs and/or other instructions and/or data to be accessed by computer system 1000. Such means, instrumentalities or other approaches may include, for example, a removable storage unit 1022 and an interface 1020. Examples of the removable storage unit 1022 and the interface 1020 may include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computer system 1000 may further include a communication or network interface 1024. Communication interface 1024 enables computer system 1000 to communicate and interact with any combination of remote devices, remote networks, remote entities, etc. (individually and collectively referenced by reference number 1028). For example, communication interface 1024 may allow computer system 1000 to communicate with remote devices 1028 over communications path 1026, which may be wired and/or wireless, and which may include any combination of LANs, WANs, the Internet, etc. Control logic and/or data may be transmitted to and from computer system 1000 via communication path 1026.

In an embodiment, a tangible apparatus or article of manufacture comprising a tangible computer useable or readable medium having control logic (software) stored thereon is also referred to herein as a computer program product or program storage device. This includes, but is not limited to, computer system 1000, main memory 1008, secondary memory 1010, and removable storage units 1018 and 1022, as well as tangible articles of manufacture embodying any combination of the foregoing. Such control logic, when executed by one or more data processing devices (such as computer system 1000), causes such data processing devices to operate as described herein.

Based on the teachings contained in this disclosure, it will be apparent to persons skilled in the relevant art(s) how to make and use the invention using data processing devices, computer systems and/or computer architectures other than that shown in FIG. 10. In particular, embodiments may operate with software, hardware, and/or operating system implementations other than those described herein.

Conclusion

It is to be appreciated that the Detailed Description section, and not the Summary and Abstract sections, is intended to be used to interpret the claims. The Summary and Abstract sections may set forth one or more but not all exemplary embodiments of the invention as contemplated by the inventor(s), and thus, are not intended to limit the invention or the appended claims in any way.

While the invention has been described herein with reference to exemplary embodiments for exemplary fields and applications, it should be understood that the invention is not limited thereto. Other embodiments and modifications thereto are possible, and are within the scope and spirit of the invention. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments may perform functional blocks, steps, operations, methods, etc. using orderings different than those described herein.

References herein to "one embodiment," "an embodiment," "an example embodiment," or similar phrases, indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein.

The breadth and scope of the invention should not be limited by any of the above-described exemplary embodiments, but should be defined only in accordance with the following claims and their equivalents.

What is claimed is:

1. A method for a memory erase process for a memory device wherein the memory erase process comprises a plurality of sub-stages, the method comprising:
    verifying a dedicated memory allocated to the memory erase process is corruption free and has available storage to store information for each of the plurality of sub-stages prior to storing the information;
    erasing the dedicated memory in response to the dedicated memory being corrupted due to a prior erase of the dedicated memory;
    storing, in the dedicated memory, the information for each of the plurality of sub-stages; and
    resuming the memory erase process, after an occurrence of a stoppage in the erase process, using the information stored in the dedicated memory, wherein the information is associated with a sub-stage that completed before the stoppage.

2. The method of claim 1, further comprising:
    storing a memory sector address in the memory device being erased when the stoppage occurs.

3. The method of claim 2, wherein the storing the memory sector address comprises storing the memory sector address in the dedicated memory.

4. The method of claim 3, wherein the erasing the dedicated memory is performed
    (i) in response to an irregular stoppage in the prior erase of the dedicated memory, (ii) in response to the dedicated memory having insufficient free space, or (iii) in response to the dedicated memory having insufficient free space to store information associated with the sub-stage that completed before the stoppage.

5. The method of claim 4, wherein the erasing the dedicated memory comprises erasing the dedicated memory after a memory sector erase command.

6. The method of claim 1, wherein the dedicated memory is distinct from the memory device.

7. The method of claim 1, wherein the dedicated memory is within the memory device.

8. The method of claim 1, wherein the resuming comprises resuming the erase process after an occurrence of an event.

9. The method of claim 8, wherein the event comprises a beginning of a Power on Reset (POR).

10. The method of claim 8, wherein the event occurs after an irregular erasure stoppage.

11. The method of claim 1, wherein the information associated with the sub-stage that completed before the stoppage comprises a memory sector address in the memory device being erased when the stoppage occurs and sub-stage erasure information.

12. The method of claim 1, wherein the storing comprises storing information associated with a recent sub-stage of the erase process before non-erase event occurs.

13. The method of claim 1, further comprising:
    after a non-erase event occurs but prior to resuming the erase process, reading sub-stage information recently stored in the dedicated memory and a memory sector address associated with the sub-stage information.

14. A system comprising:
    a memory device with a plurality of memory sectors;
    a dedicated memory allocated to storing information associated with an erase process of the memory device;
    a controller configured to:
        verify the dedicated memory is corruption free and has sufficient storage available to store information for each of a plurality of sub-stages prior to storing the information;
        erase the dedicated memory, in response to the dedicated memory being corrupted due to a prior erase of the dedicated memory;
        store, in the dedicated memory, an erase sub-stage and a memory sector address being erased prior to the stoppage;
        associate the erase sub-stage with the memory sector address being erased; and
        resume erase process, after an occurrence of a stoppage in the erase process, using the information stored in the dedicated memory.

15. The system of claim 14, wherein the controller is configured to erase the dedicated memory (i) in response to an irregular stoppage in the prior erase of the dedicated memory, (ii) in response to the dedicated memory having insufficient free space, or (iii) in response to the dedicated memory having insufficient free space to store information associated with an erase sub-stage that completed before the stoppage.

16. The system of claim 14, wherein the controller is configured to read the erase sub-stage and the memory sector address.

17. The system of claim 16, wherein the controller is configured to read the information after an event occurs.

18. The system of claim 17, wherein the event comprises a beginning of Power on Reset (POR).

19. The system of claim 18, wherein the event occurs after an irregular erasure stoppage.

20. The system of claim 17, wherein the controller is configured to read erase sub-stage information, after a non-erase event occurs but prior to resuming the erase process, recently stored in the dedicated memory and the memory sector address associated with the erase sub-stage information.

* * * * *